(12) United States Patent
Meng (10) Patent No.: US 9,479,148 B2
(45) Date of Patent: Oct. 25, 2016

(54) SERIAL DATA SIGNAL EDGE DETECTION

(71) Applicant: Lenovo Enterprise Solutions (Singapore) PTE. LTD., New Tech Park (SG)

(72) Inventor: Jian Meng, Ottawa (CA)

(73) Assignee: Lenovo Enterprise Solutions (Singapore) PTE. LTD., New Tech Park (SG)

( * ) Notice: Subject to any disclaimer, the term of this patent is extended or adjusted under 35 U.S.C. 154(b) by 0 days.

(21) Appl. No.: 14/633,005

(22) Filed: Feb. 26, 2015

(65) Prior Publication Data

US 2016/0254804 A1    Sep. 1, 2016

(51) Int. Cl.
*H03M 9/00* (2006.01)
*H03K 5/08* (2006.01)
*H03K 5/1534* (2006.01)
*H03K 5/24* (2006.01)
*H03K 19/21* (2006.01)

(52) U.S. Cl.
CPC ............. *H03K 5/08* (2013.01); *H03K 5/1534* (2013.01); *H03K 5/24* (2013.01); *H03K 19/21* (2013.01); *H03M 9/00* (2013.01)

(58) Field of Classification Search
CPC ..... H04L 7/046; H04L 7/033; H04L 7/0338; H04L 7/0004; H04L 7/101; H04L 7/0331; H04L 25/05; H04L 25/4902; H03M 9/00; G01R 31/31715; G01R 31/31922; G01R 31/31937; G01R 31/31728; G09G 3/2096; G09G 3/3688; H03K 5/08; H03K 5/24; H03K 5/1534; H03K 19/21
USPC ................ 341/100, 101; 375/238, 360, 376; 714/70
See application file for complete search history.

(56) References Cited

U.S. PATENT DOCUMENTS

| 5,357,249 | A | * | 10/1994 | Azaren | H04J 3/062 331/25 |
| 5,757,297 | A | * | 5/1998 | Ferraiolo | H04L 7/0338 341/100 |
| 5,798,720 | A | * | 8/1998 | Yano | H03K 5/1534 341/100 |
| 6,529,148 | B1 | * | 3/2003 | Maddux | H04L 7/10 341/100 |
| 6,765,973 | B1 | | 7/2004 | Miller et al. | |
| 7,221,295 | B2 | | 5/2007 | Carley | |
| 7,298,299 | B1 | * | 11/2007 | Cheung | H04L 7/0338 341/100 |
| 7,366,267 | B1 | | 4/2008 | Lee et al. | |
| 7,543,209 | B2 | | 6/2009 | Bonneau et al. | |
| 9,264,218 | B2 | | 2/2016 | Meng | |
| 2004/0258328 | A1 | | 12/2004 | Adler | |

(Continued)

FOREIGN PATENT DOCUMENTS

| JP | 408272952 | * 10/1996 | G06T 5/00 |
| JP | 2012156776 | 8/2012 | |

*Primary Examiner* — Lam T Mai (74) *Attorney, Agent, or Firm* — Katherine Brown (57) ABSTRACT

A clamping circuit clamps a serial data signal between a first high voltage level and a first low voltage level to yield a clamped serial data signal. A first comparator circuit compares the clamped serial data signal to a second high voltage level less than the first high voltage level to yield a high output equal to one just when a voltage of the clamped serial data signal is greater than the second high voltage level. A second comparator circuit compares the clamped serial data signal to second low voltage level greater than the first low voltage level to yield a low output equal to one just when the voltage of the clamped serial data signal is greater than the second low voltage level. An edge circuit detects an edge of the serial data signal from the high output and the low output.

17 Claims, 6 Drawing Sheets

(56) References Cited

U.S. PATENT DOCUMENTS

| | | | |
|---|---|---|---|
| 2005/0108600 A1* | 5/2005 | Arguelles | G01R 31/31715 714/701 |
| 2005/0286643 A1 | 12/2005 | Ozawa et al. | |
| 2008/0218389 A1* | 9/2008 | Yamagata | G09G 3/2096 341/100 |
| 2010/0220828 A1 | 9/2010 | Fuller et al. | |
| 2012/0027133 A1 | 2/2012 | Raman et al. | |
| 2012/0176159 A1 | 7/2012 | Webb et al. | |
| 2012/0189086 A1 | 7/2012 | Cai et al. | |
| 2014/0002283 A1* | 1/2014 | Yang | H03M 9/00 341/100 |
| 2014/0016718 A1 | 1/2014 | Ravinuthula et al. | |
| 2015/0098538 A1 | 4/2015 | Wiley et al. | |

* cited by examiner

[502] COMPARE CLAMPED SERIAL DATA SIGNAL TO COMPARISON HIGH VOLTAGE LEVEL TO YIELD HIGH OUTPUT OF ONE JUST WHEN VOLTAGE OF CLAMPED DATA SIGNAL IS GREATER THAN COMPARISON HIGH VOLTAGE LEVEL

[504] COMPARE CLAMPED SERIAL DATA SIGNAL TO COMPARISON LOW VOLTAGE LEVEL TO YIELD LOW OUTPUT OF ONE JUST WHEN VOLTAGE OF CLAMPED DATA SIGNAL IS GREATER THAN COMPARISON LOW VOLTAGE LEVEL

- DECODE EACH LOGIC ONE AND NUMBER OF UIs FOR EACH LOGIC ONE — 1202
- DECODE EACH LOGIC ZERO AND NUMBER OF UIs FOR EACH LOGIC ZERO — 1204
- REASSEMBLE SERIAL DATA SIGNAL FROM DECODED LOGIC ONES, LOGIC ZEROS, AND NUMBERS OF UIs — 1206

FIG 13

| EDGE DETECTED | RISING | FALLING | RISING |
|---|---|---|---|
| NUMBER OF UIs AT DETECTED EDGE THAT ELAPSED | 1 | 3 | 1 |
| LOGIC VALUE | 0 | 1 | 0 |
| NUMBER OF UIs FOR LOGIC VALUE | 1 | 3 | 1 |
| REASSEMBLED DATA SIGNAL | 0 | 1 1 1 | 0 |

122, 124, 126

SERIAL DATA SIGNAL EDGE DETECTION

BACKGROUND

Data signals within computing systems are often transmitted from a transmitter to a receiver. The transmitter and the receiver may be located on the same circuit board or different circuit boards. The latter circuit boards may be located in the same computing device, or in different devices. One type of data signal is a serial data signal, in which the signal changes between a high value corresponding to logic one and a low value corresponding to logic zero over time.

SUMMARY

An example method includes clamping, by a clamping circuit, a serial data signal between a first high voltage level and a first low voltage level, to yield a clamped serial data signal. The method includes comparing, by a first comparator circuit, the clamped serial data signal to a second high voltage level less than the first high voltage level, to yield a high output equal to one just when a voltage of the clamped serial data signal is greater than the second high voltage level. The method includes comparing, by a second comparator circuit, the clamped serial data signal to second low voltage level greater than the first low voltage level, to yield a low output equal to one just when the voltage of the clamped serial data signal is greater than the second low voltage level. The method includes detecting, by an edge circuit, an edge of the serial data signal from the high output and the low output.

An example circuit includes a clamping circuit to generate a clamped serial data signal by clamping a serial data signal between a first clamped voltage level and a second clamped voltage level. The circuit includes a high comparator circuit to generate a high output of one just when a voltage of the clamped serial data signal is greater than a first comparison voltage level less than the first clamped voltage level. The circuit includes a low comparator circuit to generate a low output of one just when the voltage of the clamped serial data signal is greater than a second comparison voltage level greater than the second clamped voltage level. The circuit includes an edge circuit to detect an edge of the serial data signal from the high output and the low output.

Another example circuit includes means for generating a clamped serial data signal by clamping a serial data signal between a first clamped voltage level and a second clamped voltage level. The circuit includes means for generating a high output of one just when a voltage of the clamped serial data signal is greater than a first comparison voltage level less than the first clamped voltage level. The circuit includes means for generating a low output of one just when the voltage of the clamped serial data signal is greater than a second comparison voltage level greater than the second clamped voltage level. The circuit includes means for detecting an edge of the serial data signal from the high output and the low output.

BRIEF DESCRIPTION OF THE SEVERAL VIEWS OF THE DRAWINGS

The drawings referenced herein form a part of the specification. Features shown in the drawing illustrate only some embodiments of the disclosure, and not of all embodiments of the disclosure, unless the detailed description explicitly indicates otherwise, and readers of the specification should not make implications to the contrary.

DETAILED DESCRIPTION

The following detailed description of exemplary embodiments of the disclosure refers to the accompanying drawings that form a part of the description. The drawings illustrate specific exemplary embodiments in which the disclosure may be practiced. The detailed description, including the drawings, describes these embodiments in sufficient detail to enable those skilled in the art to practice the disclosure. Those skilled in the art may further utilize other embodiments of the disclosure, and make logical, mechanical, and other changes without departing from the spirit or scope of the disclosure. Readers of the following detailed description should, therefore, not interpret the description in a limiting sense, and only the appended claims define the scope of the embodiment of the disclosure.

As noted in the background, serial data signals are commonly transmitted from a transmitter to a receiver. When a receiver receives an incoming serial data signal, the receiver has to decode the signal correctly in order to maintain the fidelity of the signal. Existing decoding techniques generally rely on recovering clocks from the incoming serial data signal. However, such techniques require a high quality incoming serial data signal that has low jitter and good signal integrity. As such, these decoding techniques can require high quality and thus high cost clock circuitry, while at the same time limiting the distances over which the serial data signals can be transmitted. Furthermore, the types of printed circuit boards, or logic boards, that can be satisfactorily employed for these techniques usually have to have low insertion loss, which also adds cost.

One way to overcome these drawbacks is to rely on a decoding solution in which clocks do not have to be recovered from incoming data signals. An example of such an approach is described in the pending patent application entitled "Rising and falling edge detection and re-assembly for high speed serial data communications," filed on Jun. 10, 2014, and assigned patent application Ser. No. 14/301,190. The decoding approach described in this referenced patent application relies upon detecting the rising and falling edges of an incoming data signal to suitably reassemble the data signal. The techniques disclosed in the present patent application provide for manners by which the rising and falling edges of an incoming data signal can be detected without relying upon recovered clocks from the data signals, and thus can be used in incoming data signal reassembly approaches such as that described in the referenced patent application.

Figure 1:
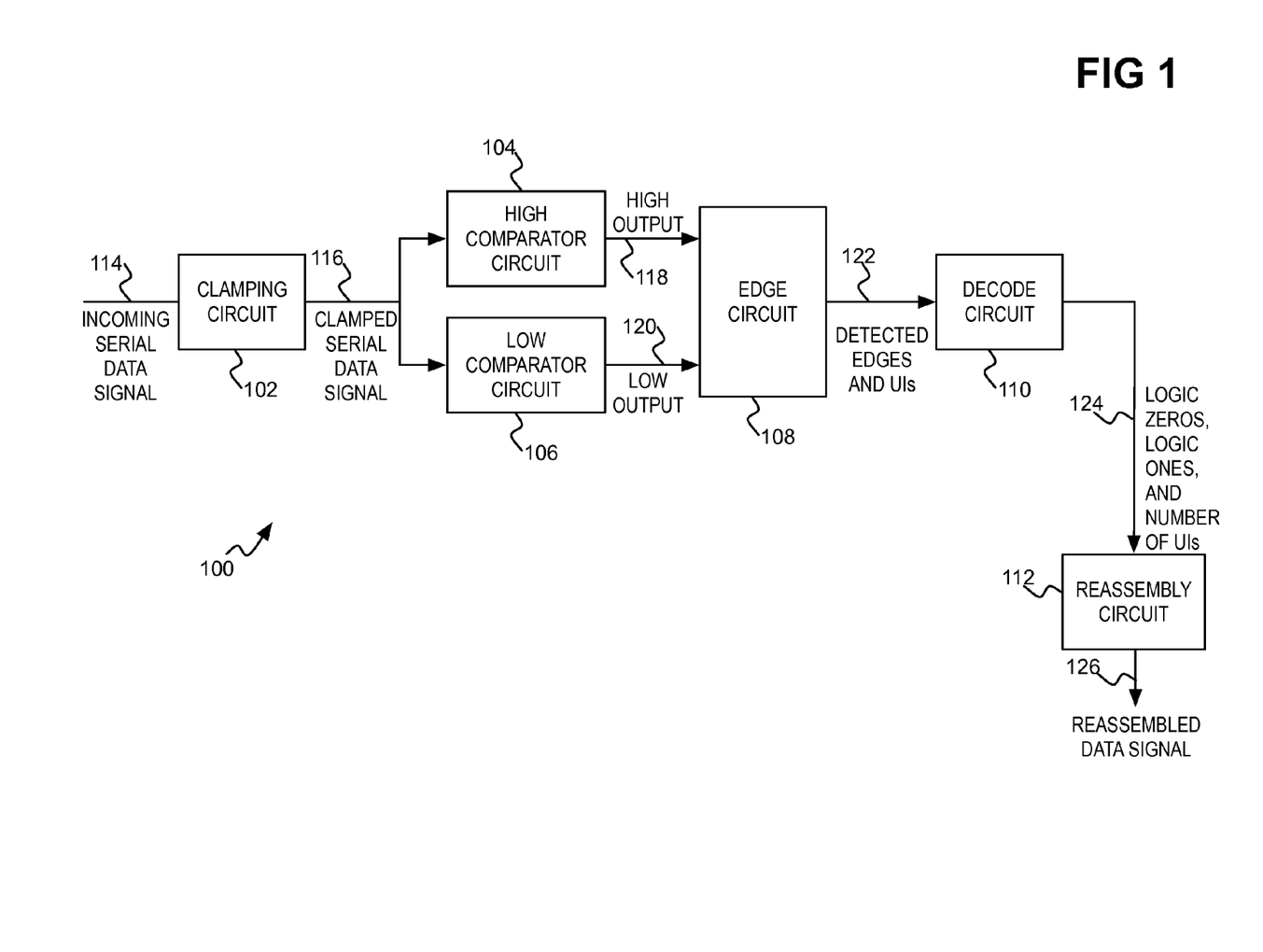
FIG. 1 is a block diagram of an example circuit for decoding and reassembling a data signal from an incoming serial data signal.

FIG. 1 shows a circuit 100 for reassembling a data signal from an incoming serial data signal. The circuit 100 includes a clamping circuit 102, a high comparator circuit 104, a low comparator circuit 106, an edge circuit 108, a decoder circuit 110, and a reassembly circuit 112. Each of the circuits 102, 104, 106, 108, 110, and 112 is now described in detail.

Figure 2:
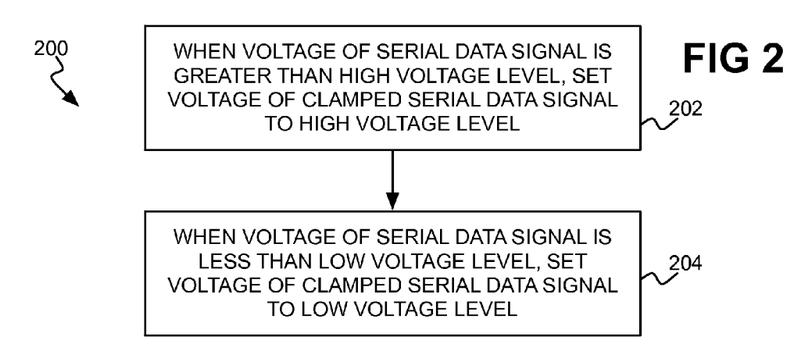
FIG. 2 is a flowchart of an example method performed by a clamping circuit of the circuit of FIG. 1.

The clamping circuit 102 of FIG. 1 clamps an incoming serial data signal 114 between a high voltage level and a low voltage level to yield a clamped serial data signal 116. FIG. 2 shows an example method 200 that the clamping circuit 102 performs to generate the clamped data signal 116 from the serial data signal 114. When the voltage of the serial data signal 114 is greater than a high voltage level, the clamping circuit 102 clamps or sets the voltage of the clamped data signal 116 to this high voltage level (202). When the voltage of the serial data signal 114 is less than a low voltage level, the clamping circuit 102 clamps or sets the voltage of the clamped data signal 116 to this low voltage level (204).

Figure 3:
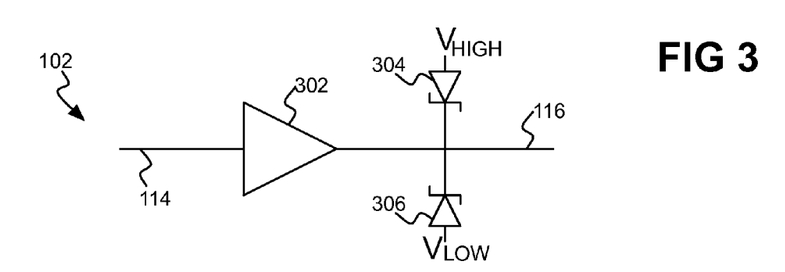
FIG. 3 is a diagram of an example clamping circuit.

FIG. 3 shows an example implementation of the clamping circuit 102. The clamping circuit 102 includes an input buffer 302 and two diodes 304 and 306, which can be zener diodes. The incoming serial data signal 114 is an input of the input buffer 302, and an output of the buffer 302 passes between the two diodes 304 and 306 to result in the clamped serial data signal 116. The anode of the diode 304 is connected to a high voltage level $V_{HIGH}$, and the anode of the diode 306 is connected to a low voltage level $V_{LOW}$. The cathodes of the diode 304 and 306 are connected to one another.

Figure 4:
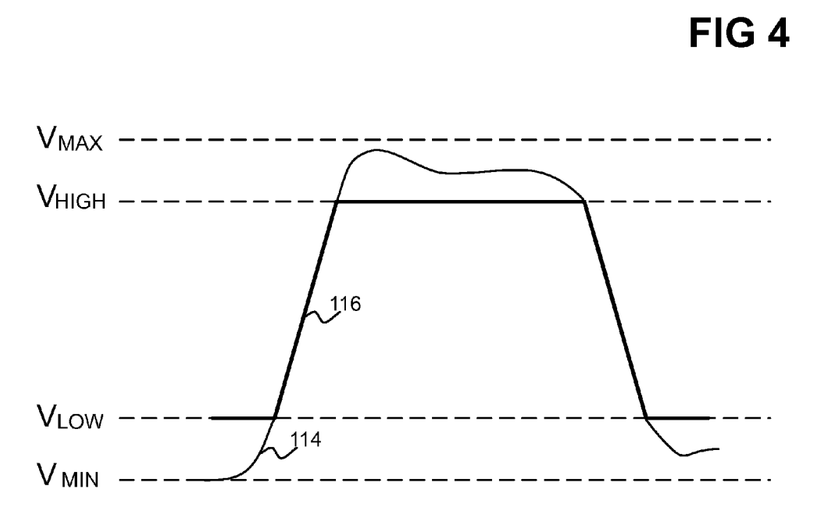
FIG. 4 is a signal diagram of an example clamped serial data signal.

FIG. 4 shows an example of the clamped serial data signal 116 that the clamping circuit 102 generates from the incoming serial data signal 114. The incoming serial data signal 114 has a voltage between $V_{MIN}$ and $V_{MAX}$. The serial data signal 114 may be of low quality, suffering from variation towards each of these voltages. The clamped data signal 116 by comparison has a voltage clamped to $V_{LOW}$ when the serial data signal 114 is below $V_{LOW}$, and clamped to $V_{HIGH}$ when the serial data signal is above $V_{HIGH}$, such that it is a higher quality signal. $V_{MIN}$ may be 0% of $V_{MAX}$, $V_{LOW}$ may be 10% of $V_{MAX}$, and $V_{HIGH}$ may be 90% of $V_{MAX}$ in one implementation.

Figure 5:
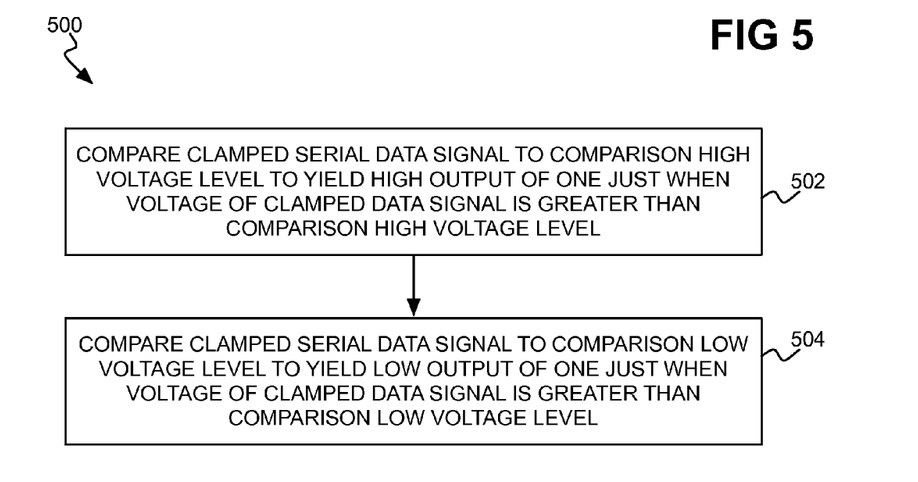
FIG. 5 is a flowchart of an example method performed by comparator circuits of the circuit of FIG. 1.

The high comparator circuit 104 of FIG. 1 generates a high output 118 and the low comparator circuit 106 of FIG. 1 generates a low output 120, based on the clamped serial data signal 116. FIG. 5 shows an example method 500 that the comparator circuits 104 and 106 perform to generate the high output 118 and the low output 120, respectively. The high comparator circuit 104 compares the clamped data signal 116 to a comparison high voltage level to set the high output 118 to one just and only when the voltage of the clamped signal 116 is greater than the comparison high voltage level (502); otherwise, the high output 118 is zero. The low comparator circuit 106 compares the clamped data signal 116 to a comparison low voltage level to set the low output 120 to one just and only when the voltage of the clamped signal 116 is greater than the comparison low voltage level (504); otherwise, the low output 120 is zero.

Figure 6:
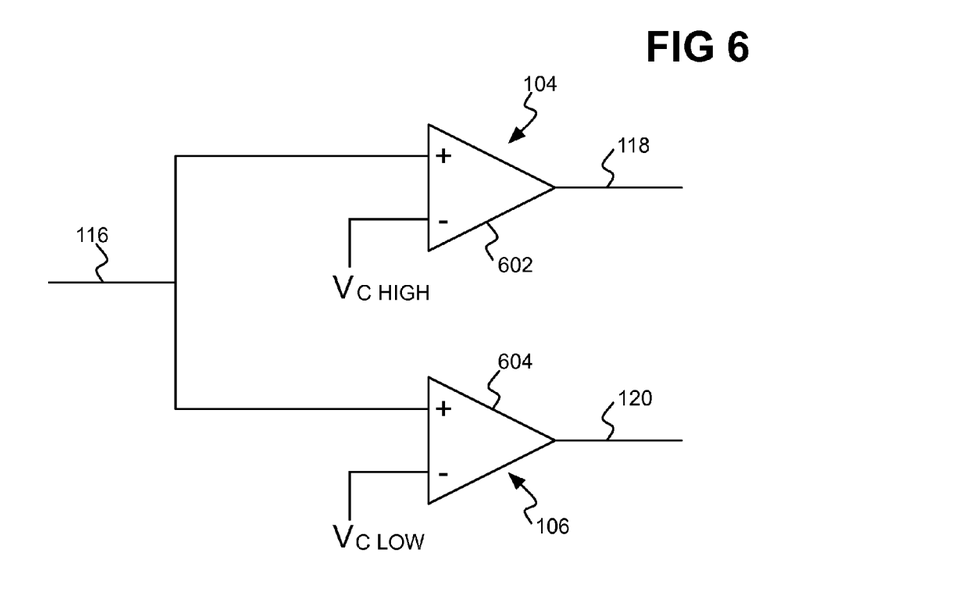
FIG. 6 is a diagram of example comparator circuits.

FIG. 6 shows an example implementation of the comparator circuits 104 and 106. The high comparator circuit 104 includes a comparator 602, and the low comparator circuit 106 includes a comparator 604. The clamped serial data signal 116 is connected to the high input of each of the comparators 602 and 604. The low input of the comparator 602 is connected to a comparison high voltage level $V_{CHIGH}$, and the low input of the comparator 604 is connected to a comparison low voltage level $V_{CLOW}$. $V_{CHIGH}$ may be 80% of $V_{MAX}$, and $V_{CLOW}$ may be 20% of $V_{MAX}$ in one implementation. The output of the comparator 602 is the high output 118, and the output of the comparator 604 is the low output 120.

Figure 7:
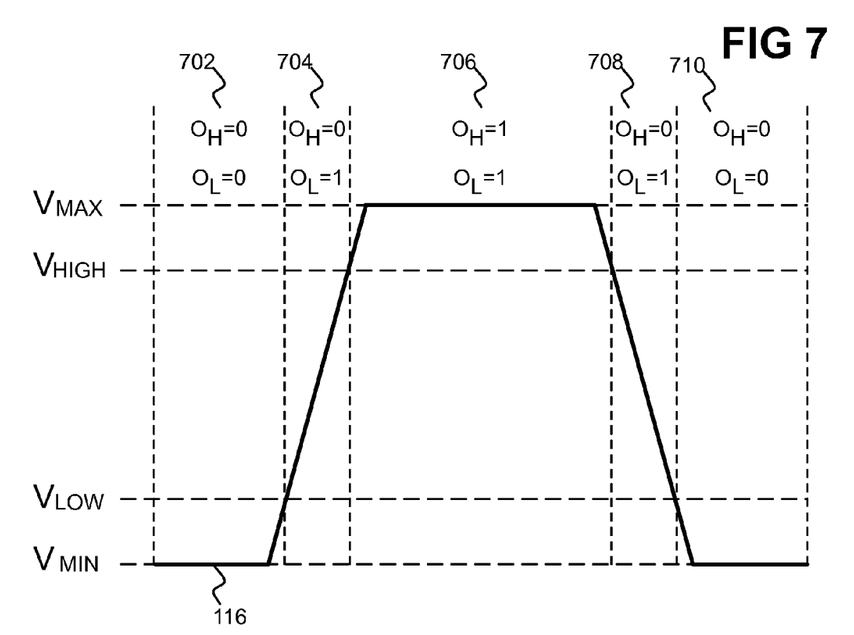
FIG. 7 is a signal diagram of example high and low outputs.

FIG. 7 shows an example of the high output 118 and the low output 120 that the comparator circuits 104 and 106 generate from the clamped serial data signal 116. The high output 118 is indicated as $O_H$ and the low output 120 is indicated as $O_L$. In time period 702, the voltage of the clamped data signal 116 is less than both $V_{CLOW}$ and $V_{CHIGH}$, so both the low output 120 and the high output 118 are each zero. In time period 704, the voltage of the clamped data signal 116 is greater than $V_{CLOW}$ but less than $V_{CHIGH}$, so the low output 120 is one and the high output 118 is zero. In time period 706, the voltage of the clamped signal 116 is greater than both $V_{CLOW}$ and $V_{CHIGH}$, so both the low output 120 and the high output 118 are each one. In time period 708, like the time period 704, the voltage of the clamped signal 116 is greater than $V_{CLOW}$ but less than $V_{CHIGH}$, so the low output 120 is one and the high output 118 is zero. In time period 710, like the time period 702, the voltage of the clamped signal 116 is less than both $V_{CLOW}$ and $V_{CHIGH}$, so both the low output 120 and the high output 118 are each zero.

The edge circuit 108 of FIG. 1 detects rising and falling edges of the incoming serial data signal 114 from the high output 118 and the low output 120 to yield detected edges and corresponding unit intervals (UIs) 122. A UI is the minimum time interval between condition changes of a data transmission signal. Time lengths are measured using an internal clock of the edge circuit 108, and not based on a recovered clock of the serial data signal 114.

Figure 8:
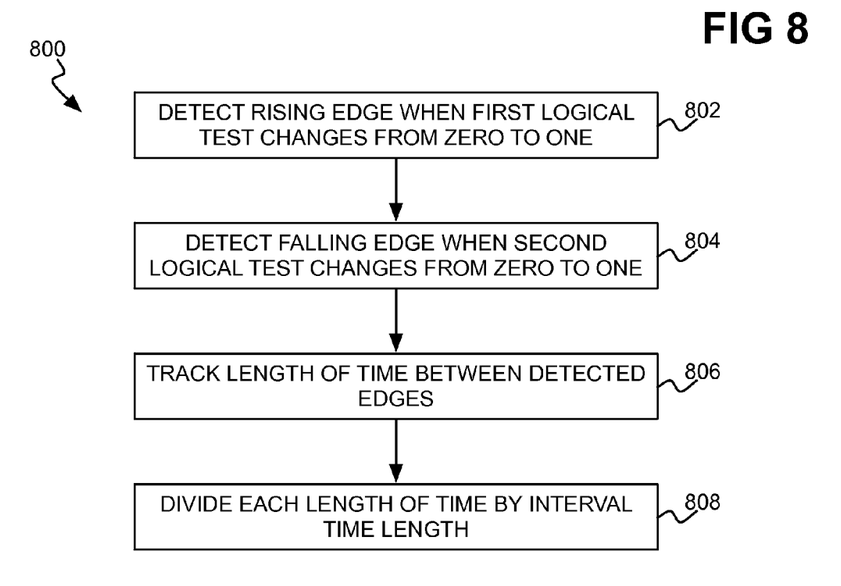
FIG. 8 is a flowchart of an example method performed by an edge circuit of the circuit of FIG. 1.

FIG. 8 shows an example method 800 that the edge circuit 108 performs to generate the detected edges and UIs 122. A rising edge is detected when a first logical test of the high output 118 and the low output 120 changes from zero to one (802). A falling edge is detected when a second logical test of the high output 118 and the low output 120 changes from one to zero (804).

In one implementation, the first logical test is both a logical exclusive inverse OR (XNOR) operation of the high output 118 and the low output 120 being equal to one and a logical AND operation of the high output 118 and the low output 120 being equal to one. In this implementation, the second logical test is a logical XNOR operation of the high output 118 and the low output 120 being equal to one and a logical OR operation of the high output 118 and the low output 120 being equal to zero. In another implementation, the first logical test is a logical AND operation of the high output 118 and the low output 120 being equal to one, and the second logical test is a logical inverse OR (NOR) operation of the high output 118 and the low output 120 being equal to one.

When an edge is detected, a length of time that elapsed between this edge and the immediately previous detected edge is tracked or recorded (806). Each such length of time is divided by an interval time length (808), which is the number of UIs corresponding to the currently detected edge, and is the number of UIs that the incoming serial data signal 114 had a value corresponding to the previous edge. For example, a rising edge may be detected, and then a falling edge detected thereafter. The length of time between detection of the rising edge and the detection of the falling edge may be is divided by a standard interval time length for the incoming serial data signal 114 to yield the number of UIs corresponding to the falling edge and which is the number of UIs that the incoming data signal had a high value (i.e., logic one). Tracking the lengths of time that elapsed between detected edges and dividing the lengths of time by a standard interval time length can be implemented via existing, standard, or another type of circuit, using appropriate circuitry.

Figure 9:
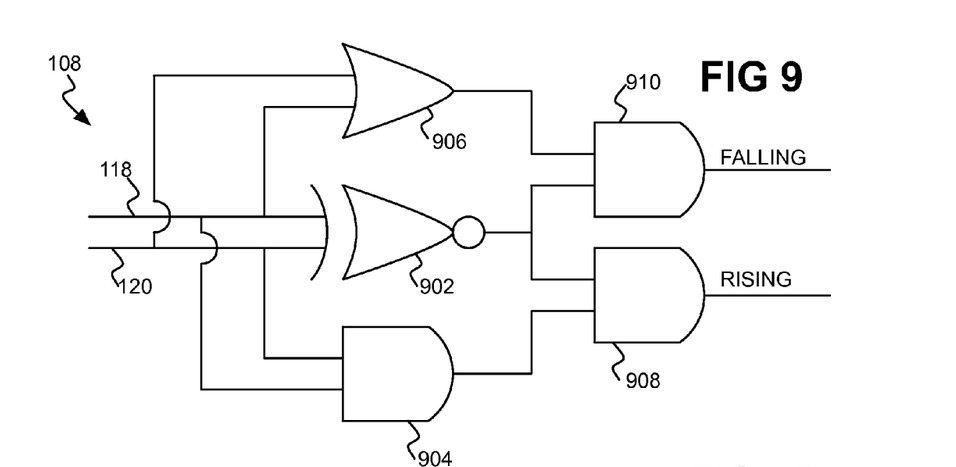
FIGS. 9 and 10 are diagrams of different example edge circuits.

FIG. 9 shows an example implementation of a portion of the edge circuit 108. The edge circuit 108 includes an XNOR circuit 902, an AND circuit 904, an OR circuit 906, and AND circuits 908 and 910. The high output 118 and the low output 120 are input into each of the XNOR circuit 902, the AND circuit 904, and the OR circuit 906, which perform a logical XNOR operation, a logical AND operation, and a logical OR operation, respectively, of the outputs 118 and 120. The output of the XNOR circuit 902 is input into each of the AND circuits 908 and 910. The output of the AND circuit 904 is also input into the AND circuit 908, which performs a logical AND operation of its inputs. The output of the OR circuit 906 is also input into the AND circuit 910, which performs a logical AND operation of its inputs. When the output of the AND circuit 908 changes from zero to one, a rising edge is detected. When the output of the AND circuit 910 changes from zero to one, a falling edge is detected.

Figure 10:
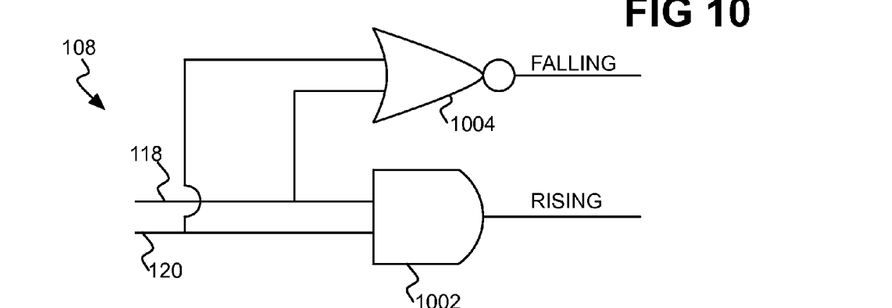

FIG. 10 shows another example implementation of the same portion of the edge circuit 108. The edge circuit 108 includes an AND circuit 1002 and a NOR circuit 1004. The high output 118 and the low output 120 are input into each of the AND circuit 1002 and the NOR circuit 1004, which perform a logical AND operation and a logical NOR operation, respectively, of the outputs 118 and 120. When the output of the AND circuit 1002 changes from zero to one, a rising edge is detected. When the output of the NOR circuit 1004 changes from zero to one, a falling edge is detected.

Figure 11:
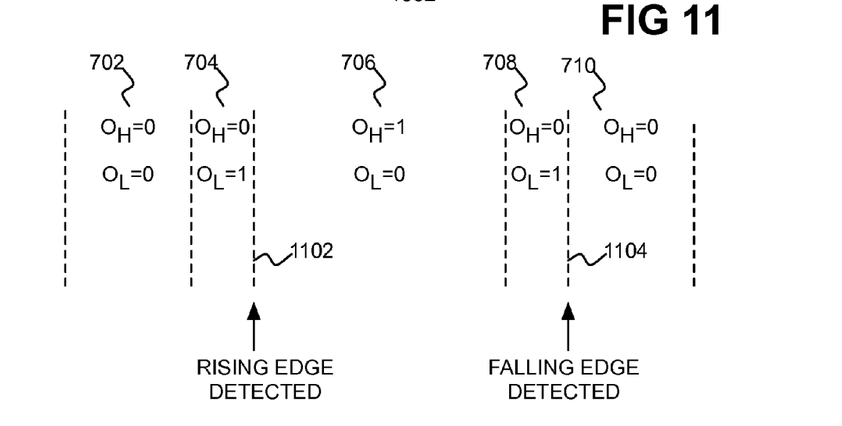
FIG. 11 is a timing diagram of example edge detection.

FIG. 11 shows an example timing diagram in relation to the high output 118, indicated as $O_H$, and the low output 120, indicated as $O_L$, over the time periods 702, 704, 706, 708, and 710 of FIG. 7. At transition 1102 from the time period 704 to the time period 706 the first logical test changes from zero to one, indicating that a rising edge has been detected. The time that has elapsed between this detection of a rising edge and detection of an immediately preceding falling edge (not shown in FIG. 11) divided by the standard interval time length is the number of UIs that the incoming serial data signal 114 had a low (i.e., logic zero) value prior to changing to a high (i.e., logic one) value at the transition 1102. At transition 1104 from the time period 708 to the time period 710 the second logical test changes from one to zero, indicating that a falling edge has been detected. The time that has elapsed between this detection of the falling edge and detection of the immediately preceding rising edge (i.e., at the transition 1102) divided by the standard interval time length is the number of UIs that the serial data signal 116 had a high (i.e., logic one) value prior to changing to a low (i.e., logic zero) value at the transition 1104.

The decoder circuit 110 of FIG. 1 decodes logic ones and logic zeros, and the number of UIs for each logic one and each logic zero, within the incoming serial data signal 114 from the detected edges and the UIs 122 output by the edge circuit 108. The output of the decoder circuit 110 is thus logic zeros, logic ones, and the number of UIs for each logic one and each logic zero 124. The reassembly circuit 112 of FIG. 1 then generates a reassembled data signal 126 corresponding to the serial data signal 114, from the logic zeros, logic ones, and the number of UIs 124.

Figure 12:
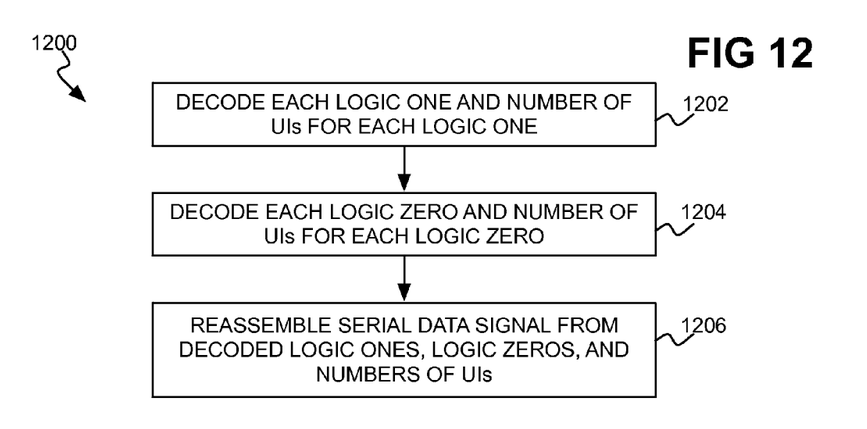
FIG. 12 is a flowchart of an example method performed by a decoder circuit and a reassembly circuit of the circuit of FIG. 1.

FIG. 12 shows an example method 1200 that the decoder circuit 110 and the reassembly circuit 112 perform. As shown in FIG. 12, the method 1200 is performed after the edges have been detected. However, in actuality, parts of the method 1200 is performed each time an edge is detected, where part 1202 is performed for a detected falling edge, and part 1204 is performed for a detected rising edge. Part 1206 is performed each time an edge is detected, regardless of whether it is a falling edge or a rising edge.

Each logic one and the number of UIs corresponding to the length of time for each logic one is decoded (1202), as is each logic zero and the number of UIs corresponding to the length of time for each logic zero (1204), by the decoder circuit 110. Specifically, when a detected edge is a rising edge, such that the immediately prior detected edge is a falling edge, a logic zero is detected. The number of UIs for the logic zero is the number of UIs that elapsed between the detected rising edge and the immediately prior detected falling edge. Similarly, when a detected edge is a falling edge, such that the immediately prior detected edge is a rising edge, a logic one is detected. The number of UIs for the logic one is the number of UIs that elapsed between the detected falling edge and the immediately prior detected rising edge.

The output of parts 1202 and 1204 is thus the logic zeros, logic ones, and the number of UIs 124. The data signal 114 is then reassembled from these decoded logic ones, logic zeros, and numbers of UIs 124 (1206), by the reassembly circuit 112. The data signal may be reassembled in serial form, like the incoming serial data signal 114, or may be reassembled in parallel form. The decoder circuit 110 and the reassembly 126 can be implemented via existing, standard, or other types of circuits, using appropriate circuitry.

Figure 13:
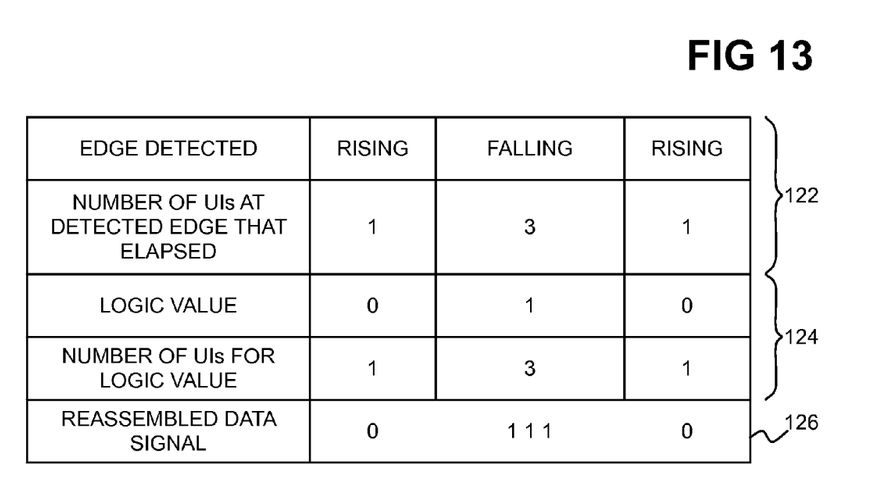
FIG. 13 is a table of how an example reassembled data signal ultimately generated from detected edges within an incoming serial data signal.

FIG. 13 is a table depicting example performance of the method 1200 by the decoder circuit 110 and the reassembly circuit 112, ultimately resulting in generation of the reassembled data signal 126 by the reassembly circuit 112 from the detected edges and the UIs 122 input to the decoder circuit 110. For the initial detected rising edge after one UI has elapsed, the decoder circuit 110 decodes a logic zero as having occurred for one UI. For the detected falling edge after three UIs have elapsed, the decoder circuit 110 decodes a logic one as having occurred for three UIs. For the last detected rising edge after one UI has elapsed, the decoder circuit 110 decodes a logic zero as having occurred for one UI. As such, the reassembly circuit 112 generates the reassembled data signal 126 as 0x01110, in either serial or parallel form.

The edge detection techniques described herein provide for the detection of rising and falling edges to decode serial data transmitted within an incoming serial data signal without having to recover a clock from the incoming signal itself. As such, these techniques can be implemented in a less costly manner than existing such techniques. It is further noted that, although specific embodiments have been illustrated and described herein, it will be appreciated by those of ordinary skill in the art that any arrangement calculated to achieve the same purpose may be substituted for the specific embodiments shown. This application is thus intended to cover any adaptations or variations of embodiments of the present invention. As such and therefore, it is manifestly intended that this invention be limited only by the claims and equivalents thereof.

I claim:

1. A method comprising:
   clamping, by a clamping circuit, a serial data signal between a first high voltage level and a first low voltage level, to yield a clamped serial data signal;
   comparing, by a first comparator circuit, the clamped serial data signal to a second high voltage level less than the first high voltage level, to yield a high output equal to one just when a voltage of the clamped serial data signal is greater than the second high voltage level;
   comparing, by a second comparator circuit, the clamped serial data signal to second low voltage level greater than the first low voltage level, to yield a low output equal to one just when the voltage of the clamped serial data signal is greater than the second low voltage level; and
   detecting, by an edge circuit, an edge of the serial data signal from the high output and the low output,
   wherein clamping the serial data signal comprises:
      when a voltage of the serial data signal is greater than the first high voltage level, setting the voltage of the clamped serial data signal to the first high voltage level; and
      when the voltage of the serial data signal is less than the first low voltage level, setting the voltage of the clamped serial data signal to the first low voltage level.

2. The method of claim 1, wherein detecting the edge comprises:
   when an output of a first logical test changes from zero to one, detecting the edge as a rising edge of the serial data signal; and
   when an output of a second logical test changes from zero to one, detecting the edge as a falling edge of the data signal.

3. The method of claim 2, wherein the first logical test comprises a logical exclusive inverse OR (XNOR) operation of the high output and the low output being equal to one and a logical AND operation of the high output and the low output being equal to one,
   and wherein the second logical test comprises the logical XNOR operation of the high output and the low output being equal to one and a logical OR operation of the high output and the low output being equal to zero.

4. The method of claim 2, wherein the first logical test comprises a logical AND operation of the high output and the low output being equal to one,
   and wherein the second logical test comprises a logical inverse OR (NOR) operation of the high output and the low output being equal to one.

5. The method of claim 2, further comprising:
   tracking, by the edge circuit, a length of time that elapsed between an immediately prior edge of the serial data signal and the edge.

6. The method of claim 5, further comprising:
   dividing, by the edge circuit, the length of time by an interval time length to determine a number of unit intervals (UIs) that elapsed between the immediately prior edge and the edge.

7. The method of claim 6, further comprising:
   decoding, by a decoder circuit, a number of logic zeros within the serial data signal as equal to the number of UIs when the edge is the rising edge such that the immediately prior edge is the falling edge; and
   decoding, by the decoder circuit, a number of logic ones within the serial data signal as equal to the number of UIs when the edge is the falling edge such that the immediately prior edge is the rising edge.

8. The method of claim 7, further comprising:
   serially reassembling, by a reassembly circuit, the serial data signal from an output of the decoder circuit.

9. The method of claim 7, further comprising:
   reassembling, in parallel form, by a reassembly circuit, the serial data signal from an output of the decoder circuit.

10. A circuit comprising:
    a clamping circuit to generate a clamped serial data signal by clamping a serial data signal between a first clamped voltage level and a second clamped voltage level;
    a high comparator circuit to generate a high output of one just when a voltage of the clamped serial data signal is greater than a first comparison voltage level less than the first clamped voltage level;
    a low comparator circuit to generate a low output of one just when the voltage of the clamped serial data signal is greater than a second comparison voltage level greater than the second clamped voltage level; and
    an edge circuit to detect an edge of the serial data signal from the high output and the low output,
    wherein the edge circuit is to:
       when an output of a first logical test changes from zero to one, detect the edge as a rising edge of the serial data signal; and
       when an output of a second logical test changes from zero to one, detect the edge as a falling edge of the data signal.

11. The circuit of claim 10, wherein the clamping circuit is to:
    when a voltage of the serial data signal is greater than the first clamped voltage level, clamp the voltage of the clamped serial data signal to the first clamped voltage level; and
    when the voltage of the serial data signal is less than the second clamped voltage level, clamp the voltage of the clamped serial data signal to the second clamped voltage level.

12. The circuit of claim 10, wherein the edge circuit comprises:
    an exclusive inverse OR (XNOR) circuit to perform a logical XNOR operation of the high output and the low output;
    a first AND circuit to perform a logical AND operation of the high output and the low output;
    an OR circuit to perform a logical OR operation of the high output and the low output;
    a second AND circuit to perform the logical AND operation of an output of the XNOR circuit and an output of the first AND circuit, to yield the output of the first logical test; and
    a third AND circuit to perform the logical AND operation of the output of the XNOR circuit and an output of the OR circuit, to yield the output of the second logical test.

13. The circuit of claim 11, wherein the edge circuit comprises:
    an AND circuit to perform a logical AND operation of the high output and the low output to yield the output of the first logical test; and
    an inverse OR (NOR) circuit to perform a logical NOR operation of the high output and the low output to yield the output of the second logical test.

14. The circuit of claim 11, wherein the edge circuit is to:

track a length of time that elapsed between an immediately prior edge of the serial data signal and the edge; and divide the length of time by an interval time length to determine a number of unit intervals (UIs) that elapsed between the immediately prior edge and the edge.

15. The circuit of claim 14, further comprising:

a decoder circuit to:

decode a number of logic zeros within the serial data signal as equal to the number of UIs when the edge is the rising edge such that the immediately prior edge is the falling edge, and decode a number of logic ones within the serial data signal as equal to the number of UIs when the edge is the falling edge such that the immediately prior edge is the rising edge.

16. The circuit of claim 15, further comprising:

a reassembly circuit to reassemble the serial data signal from an output of the decoder circuit, in one of serial form and parallel form.

17. A circuit comprising:

means for generating a clamped serial data signal by clamping a serial data signal between a first clamped voltage level and a second clamped voltage level;

means for generating a high output of one just when a voltage of the clamped serial data signal is greater than a first comparison voltage level less than the first clamped voltage level;

means for generating a low output of one just when the voltage of the clamped serial data signal is greater than a second comparison voltage level greater than the second clamped voltage level; and means for detecting an edge of the serial data signal from the high output and the low output, wherein the means for detecting the edge of the serial data signal is further for:

when an output of a first logical test changes from zero to one, detecting the edge as a rising edge of the serial data signal; and when an output of a second logical test changes from zero to one, detecting the edge as a falling edge of the data signal.

\* \* \* \* \*